US011430720B2

(12) United States Patent
Anjum et al.

(10) Patent No.: US 11,430,720 B2
(45) Date of Patent: Aug. 30, 2022

(54) RECESS LEAD FOR A SURFACE MOUNT PACKAGE

(71) Applicant: Texas Instruments Incorporated, Dallas, TX (US)

(72) Inventors: Naweed Anjum, Murphy, TX (US); Michael Gerald Amaro, Naperville, IL (US); Makarand Ramkrishna Kulkarni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 98 days.

(21) Appl. No.: 16/940,243

(22) Filed: Jul. 27, 2020

(65) Prior Publication Data
US 2022/0028767 A1 Jan. 27, 2022

(51) Int. Cl.
*H01L 23/495* (2006.01)
*H01L 23/498* (2006.01)

(52) U.S. Cl.
CPC .. *H01L 23/49575* (2013.01); *H01L 23/49541* (2013.01); *H01L 23/49805* (2013.01)

(58) Field of Classification Search
CPC .......... H01L 23/3107; H01L 23/49541; H01L 23/49575; H01L 23/49805; H01L 2924/181; H01L 24/48; H01L 23/28; H01L 24/49; H01L 23/49503; H01L 21/56; H01L 23/49548
See application file for complete search history.

(56) References Cited

U.S. PATENT DOCUMENTS

| | | | |
|---|---|---|---|
| 6,608,366 B1* | 8/2003 | Fogelson | H01L 21/561 257/690 |
| 9,136,208 B2* | 9/2015 | Taguchi | H01L 23/49582 |
| 2006/0043566 A1* | 3/2006 | Nakanishi | H01L 23/49548 257/690 |
| 2008/0067698 A1* | 3/2008 | Do | H01L 23/4951 257/787 |
| 2010/0133693 A1* | 6/2010 | Arshad | H05K 3/3442 257/762 |
| 2011/0244629 A1* | 10/2011 | Gong | H01L 23/49582 438/111 |
| 2015/0348891 A1* | 12/2015 | Talledo | H01L 21/4832 257/676 |
| 2016/0254214 A1* | 9/2016 | Makino | H01L 24/32 257/676 |
| 2018/0122731 A1* | 5/2018 | Komatsu | H01L 21/561 |
| 2019/0148271 A1* | 5/2019 | Rodriguez | H01L 23/49555 257/676 |

* cited by examiner

*Primary Examiner* — Alonzo Chambliss
(74) *Attorney, Agent, or Firm* — Dawn Jos; Charles A. Brill; Frank D. Cimino

(57) ABSTRACT

A lead for a surface mount package for a semiconductor device, and the surface mount package employing the same. In one example, the lead includes a central segment with a first side and a second side, a first extension from a portion of the first side, and a second extension from a portion of the second side. The lead also includes a recess extending through a portion of the central segment, the first extension and the second extension.

18 Claims, 5 Drawing Sheets

RECESS LEAD FOR A SURFACE MOUNT PACKAGE

TECHNICAL FIELD

The present disclosure is related to packaging of semiconductor devices and, more particularly, to a surface mount package for a semiconductor device.

BACKGROUND

A variety of semiconductor device packages provide support for a semiconductor die (e.g., an integrated circuit chip) and associated wire bonds, provide protection from the environment, and enable surface mounting of the semiconductor device to and interconnection with a printed circuit board ("PCB"), typically with solder joints. For purposes of high-volume, and low-cost production of semiconductor device packages (also referred to "packages"), a semiconductor industry practice is to etch or stamp a thin sheet of metal material to form a panel or strip which defines a leadframe. A single strip may be formed to include multiple two-dimensional ("2D") arrays, with each such array including a plurality of leadframes in a particular pattern. In a semiconductor device package manufacturing process, a semiconductor die is mounted to a die attach pad and then wire bonded to leads of the leadframe. Then, an encapsulant material (encapsulant or molding compound) is applied to the strip so as to cover the semiconductor die, wire bonds, and portions of the leadframes.

Upon the hardening of the encapsulant material, the leadframes within the strip are cut apart or singulated for producing individual semiconductor device packages. Such singulation is typically accomplished via a sawing process. In a mechanical sawing process, a saw blade (or dicing blade) is advanced along "saw streets" that extend in prescribed patterns between the leadframes to separate the leadframes from one another.

To insure that every solder joint between the leads of a package and lands on the PCB has been fully wetted by solder, an option exists to visually inspect the solder connections. A "wettable flank" lead design allows for the solder to wick up the edge of the package for visual inspection because unlike traditional leaded components such as small outline integrated circuit ("SOIC") and dual-in-line ("DIP") packages, the solder joints of leadless packages such as quad flat no-lead ("QFN") surface-mount packages are formed primarily underneath the package. In the wettable flank lead, an outer region of the leads is utilized to form a recess that is sized and configured to accommodate reflowing solder therein to enable a visual solder inspection after being mounted to a package substrate such as a PCB.

QFN surface mount technology produces dimensional and inspection limitations of the wettable flank (or wettable feature) of the leadframe on a multi-layer routable circuit arrangement in the QFN package. Based on the design and manufacturability of routable leadframes, the resultant structure of the wettable feature limits desired trace dimensions, potentially causing future reliability issues as a result of the difficulty of performing an inspection. There is also a potential for producing copper burrs during a singulation process that is used to separate individual leadframes from a plurality of leadframes during a manufacturing operation. Reduction or elimination of the copper burr during a singulation process is a frequent concern with QFN packaging.

A wettable feature lead when created using a plating process produces a curved edge and may result in insufficient dimensions in a step cut. This problem is inherent in its design and in the etching process of wettable feature manufacturability for multi-layer routable leadframe substrates or otherwise. There is no presently known alternative to this problem.

Accordingly, what is needed is a design for maintaining sufficient electrical isolation between adjacent wettable feature leads of a leadframe employable with surface mount packaging technology.

SUMMARY OF THE DISCLOSURE

These and other problems are generally solved or circumvented, and technical advantages are generally achieved, by advantageous embodiments of the present disclosure for a lead for a surface mount package for a semiconductor device, and the surface mount package employing the same. In one example, the lead includes a central segment with a first side and a second side, a first extension from a portion of the first side, and a second extension from a portion of the second side. The lead also includes a recess extending through a portion of the central segment, the first extension and the second extension.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated that the specific examples disclosed may be readily utilized as a basis for modifying or designing other structures or processes for carrying out the same purposes of the present disclosure. It should also be realized that such equivalent constructions do not depart from the spirit and scope of the disclosure as set forth in the appended claims.

BRIEF DESCRIPTION OF THE DRAWINGS

For a more complete understanding of the present disclosure, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred examples and are not necessarily drawn to scale.

DETAILED DESCRIPTION

The making and using of the examples are discussed in detail below. It should be appreciated, however, that the present disclosure provides many applicable concepts that can be embodied in a wide variety of specific contexts. The specific examples discussed are merely illustrative of specific ways to make and use the disclosure, and do not limit the scope of the disclosure.

The present disclosure will be described with respect to examples in a specific context, namely, a surface mount package for a semiconductor device. While the principles will be described in the environment of a QFN package, any surface mount packaging technology for a semiconductor device is well within the broad scope of the present disclosure.

Figure 1:
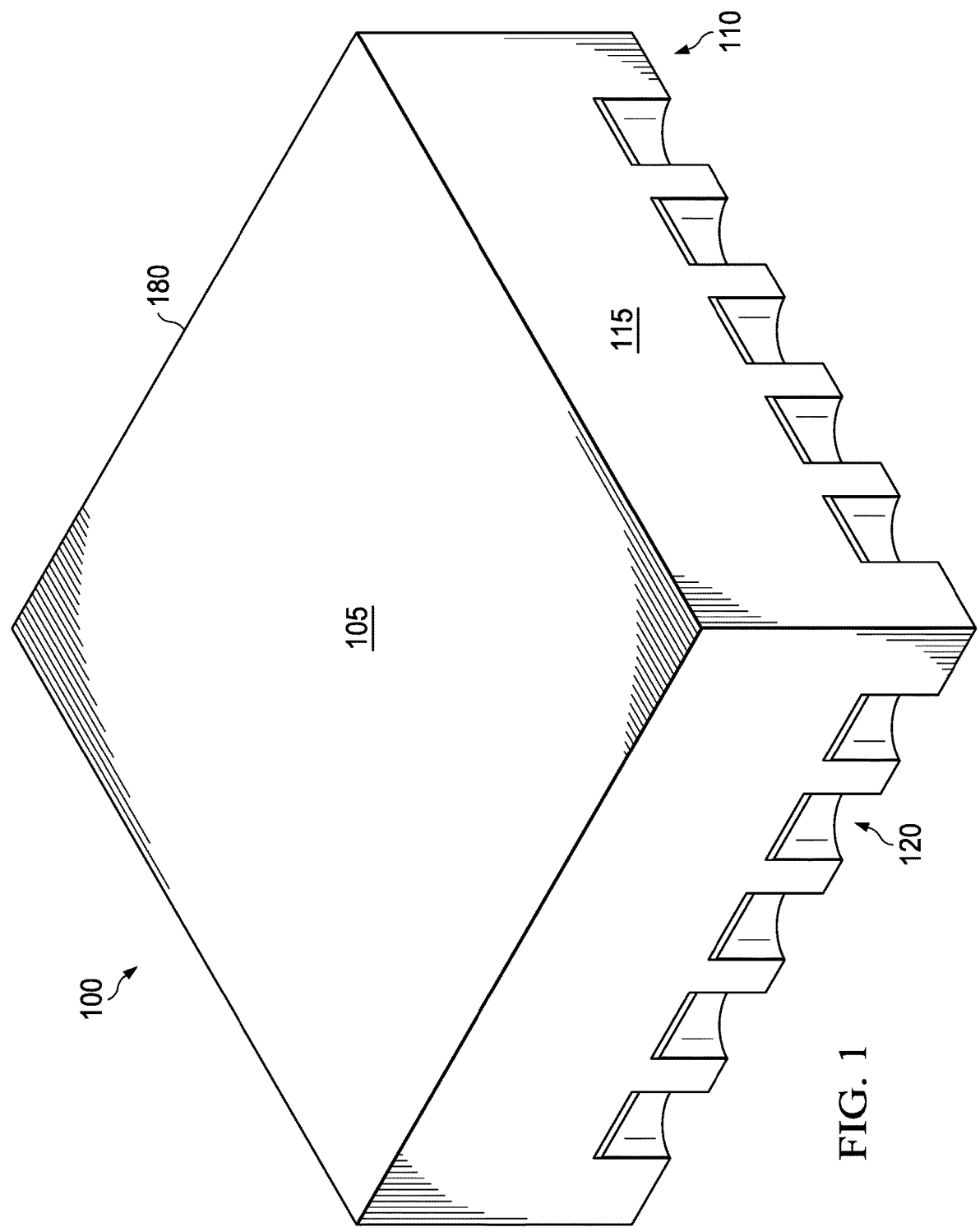
FIG. 1 illustrates a top perspective view of a surface mount package for a semiconductor device.

Turning now to FIG. 1, illustrated is a top perspective view of a surface mount package (or package) 100 for a semiconductor device. The surface mount package 100 may conform to QFN packaging technology. QFN packaging technology offers a variety of benefits including low lead inductance, a small sized "near chip-scale" footprint, a thin profile, and low weight. The package 100 has a generally rectangular or square shape with a top surface 105, a bottom surface 110, and four side surfaces (one of which is designated 115) extending between the top surface 105 and the bottom surface 110.

Spaced about the periphery of the package 100 are a plurality of leads (one of which is designated 120) for attaching the package 100 to other components. As will be appreciated, the package 100 contains at least one semiconductor die (see FIG. 3) coupled to a die attach pad and at least one of the leads 120. A portion of the leads 120 are exposed from a molding compound 180 covering the semiconductor die and the die attach pad.

Figure 2:
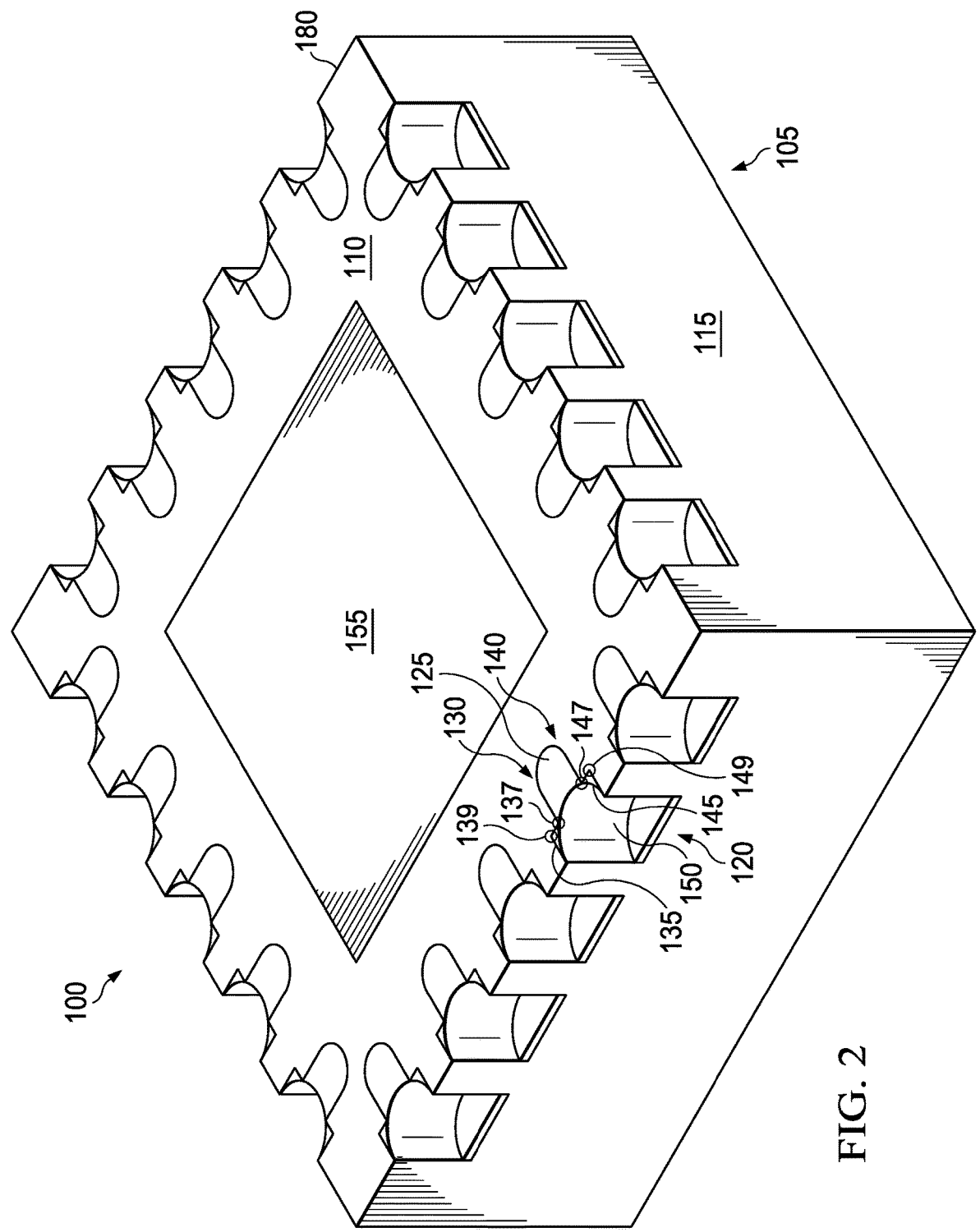
FIG. 2 illustrates a bottom perspective view of the surface mount package for the semiconductor device of FIG. 1.

Turning now to FIG. 2, illustrated is a bottom perspective view of the surface mount package 100 for the semiconductor device of FIG. 1. As mentioned above, the package 100 has a generally rectangular or square shape with a top surface 105, a bottom surface 110, and four side surfaces (one of which is designated 115) extending between the top surface 105 and the bottom surface 110. The plurality of leads (one of which is designated 120) are spaced about the periphery of the package 100 for attaching the package to, for instance, a PCB.

The leads 120 of a leadframe (see FIG. 3) and terminate on the bottom surface 110 and an adjacent side surface 115 of the package 100. The leads 120 include a central segment 125 having a first side 130 and a second side 140. A first extension 135 of the leads 120 extends from a portion of the first side 130 of the central segment 125, and a second extension 145 of the leads 120 extends from a portion of the second side 140 of the central segment 125.

A recess 150 of the leads 120 extends through a portion of the central segment 125, the first extension 135 and the second extension 145. The recess 150 is formed to accommodate reflowing solder therein to enable a visual solder inspection after assembly to a package substrate such as a PCB. Thus, the plated recess 150 provides a void or opening in the package 100 to enable wicking of the solder. The plated recess 150 of each lead 120 is plated to enhance solder wettability during subsequent processing steps when the package 100 is coupled to, for example, the PCB or other component. The recess 150 may have a concave or step shape. A die attach pad 155 may be located and exposed on the bottom surface 110 of the package 100, and provide a foundation within the surface mount package 100 for a semiconductor die (see FIG. 3).

The first extension 135 intersects a junction 137 between the central segment 125 and the recess 150 on the first side 130 of the central segment 125. The second extension 145 intersects a junction 147 between the central segment 125 and the recess 150 on the second side 140 of the central segment 125. The first extension 135 of the lead 120 includes an angular edge 139 opposite the recess 150. The second extension 145 of the lead 120 also includes an angular edge 149 opposite the recess 150.

Figure 3:
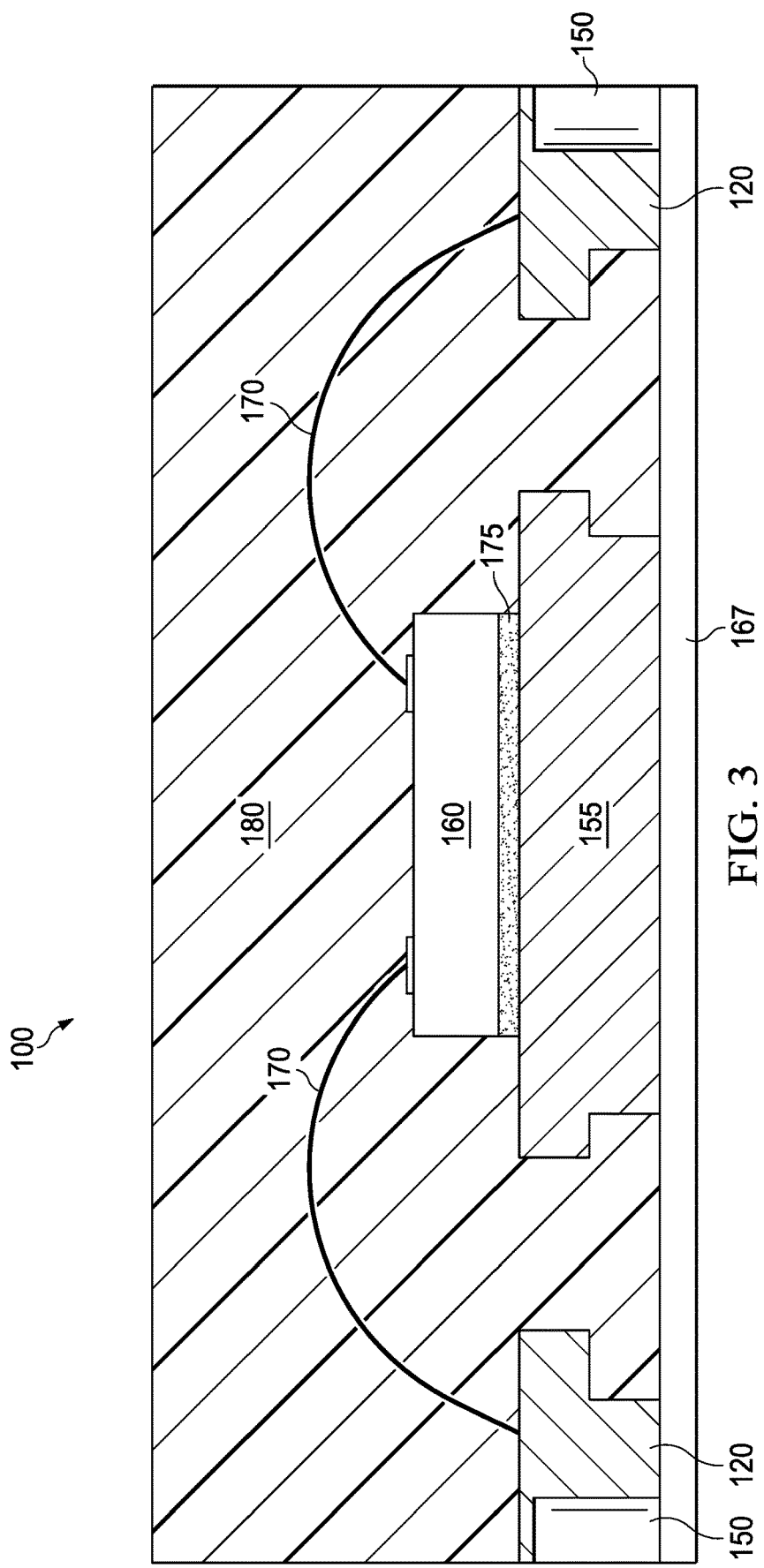
FIG. 3 illustrates a cross sectional view of the surface mount package for the semiconductor device of FIG. 1.

Turning now to FIG. 3, illustrated is a cross sectional view of the surface mount package 100 for the semiconductor device of FIG. 1. The semiconductor device includes a semiconductor die 160 attached to the plurality of leads 120 with, for example, wire bonds 170. The semiconductor die 160 may be attached to the die attach pad 155 with a die attach material 175. The leads 120 provide connectivity to another component such as a PCB 167. It should be noted that the semiconductor die 160 may be attached to another component such as a PCB 167 without being attached to the die attach pad 155. It should also be noted that the semiconductor device may employ solder bumps for connectively within and to facilitate connectivity to other components in lieu of or in conjunction with the wire bonds 170.

A portion of the leads 120 are exposed (see FIGS. 1 and 2) from the molding compound 180 (such as an epoxy compound or a compressed film molding process) covering the semiconductor die 160 to form the package 100. While one semiconductor die 160 and a single-layer are illustrated herein, it should be understood that multiple semiconductor dies and a multi-layer structure is well within the scope of the present disclosure.

A multi-layer leadframe can be formed with multi-layered traces that can be interconnected by vias. The multi-layer leadframe can be employed to address a signal routing application. When the multi-layer leadframe is employed, one of the layers, usually the bottom layer, can be formed with leads 120 as set forth herein. It should also be understood that multiple layers within the multi-layer leadframe may form features of the leads 120 (e.g., plated recess across multiple layers).

Based on a process of creating solder-wettable feature leads for semiconductor packages, the resulting shape of the lead is often crescent shaped. This shape becomes extreme for narrow pins, potentially voiding specifications of wettable features. This limitation is addressed by redesigning the etch area to reduce the impact of the crescent (concave) feature to a solder-wettable feature, one extension being on each side of and extending outwardly from opposing sides of a central segment.

The problem of a narrow or shortened geometry in a solder-wettable feature of, for instance, a multi-layer routable substrate is a result of parallel and straight-shaped leads. When such parallel and straight shaped leads are etched, they leave a crescent shaped solder-wettable base. The sharp concave shape of the crescent is solved herein by modifying the lead shape to a step style (e.g., a narrow inside portion or central segment and wider outer exposed portions or extensions), which helps with a desired step etch as well as reducing the concave crescent shape, thereby improving the integrity of the leads and the semiconductor package. Additionally, a wider copper area allows reduction of etch time, thereby reducing the lateral etch length.

Figure 4:
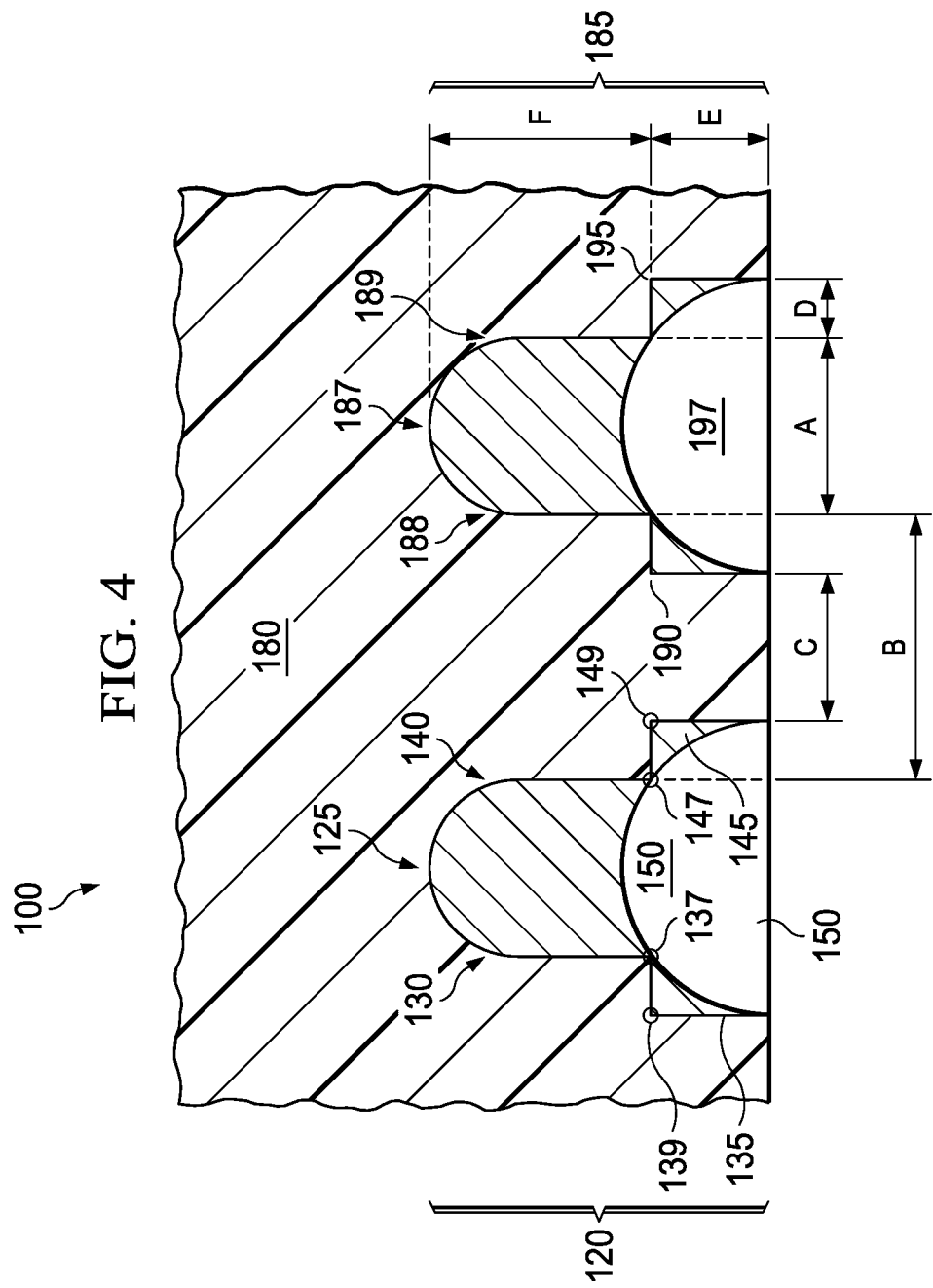
FIG. 4 illustrates a bottom view of a portion of the surface mount package for the semiconductor device of FIG. 1.

Turning now to FIG. 4, illustrated is a bottom view of a portion of the surface mount package 100 for the semiconductor device of FIG. 1. Again, the leads (one designated as a first lead 120 with respect to FIG. 4) include the central segment 125 having the first side 130 and the second side 140. The first extension 135 of the first lead 120 extends from a portion of the first side 130 of the central segment 125, and the second extension 145 of the first lead 120 extends from a portion of the second side 140 of the central segment 125. The recess 150 of the first lead 120 extends through a portion of the central segment 125, the first extension 135 and the second extension 145. A chemical etch may be employed to form the recess 150 through a portion of the central segment 125, the first extension 135 and the second extension 145.

As mentioned above, the first extension 135 intersects a junction 137 between the central segment 125 and the recess 150 on the first side 130 of the central segment 125. The second extension 145 intersects a junction 147 between the central segment 125 and the recess 150 on the second side 140 of the central segment. The first extension 135 and the second extension 145 of the lead 120 include an angular edge 139, 149, respectively, opposite the recess 150.

FIG. 4 also designates a second lead (also referred to as "another lead") 185 terminating on the bottom surface 110 and the side surface 115 of the package 100 (see FIG. 2). The second lead 185 includes a central segment 187 having the first side 188 and the second side 189. A first extension 190 of the second lead 185 extends from a portion of the first side 188 of the central segment 187, and a second extension 195 of the second lead 185 extends from a portion of the second side 189 of the central segment 187. A recess 197 of the second lead 185 extends through a portion of the central segment 187, the first extension 190 and the second extension 195 of the second lead 185. A chemical etch may be employed to form the recess 197 through a portion of the central segment 187, the first extension 190 and the second extension 195. Analogous to the first lead 120, a portion of the second lead 185 is exposed from the molding compound 180 covering the semiconductor die 160. The first and second leads 120, 185 may share analogous features.

The metal width in the etch area is increased to compensate for the etched curve in the lead area by oversizing the etch area in the exposed layer on the bottom (solderable side) of the package 100. The shape of the oversized edge is preferably curved or generally semi-circular in shape. This area when etched with an etch mask leaves the lead area of the extensions 135, 145, 190, 195 less curved/more flattened. A sufficient amount of electrically isolating molding compound 180 between adjacent leads 120, 185 remains in the compound area therebetween after etching of the leads 120, 185, which is better than a standard, etched leadframe. This option also reduces the possibility of a copper burr produced by singulation. Increasing the metal width in the etch area can be applied to leadframe technologies conventionally identified in packaging technology as, without limitation, as a molded interconnect substrate ("MIS") and grid array quad flat no-lead ("GQFN"), including pre-molded, plated, and etched designs.

When two leads 120, 185 are drawn side by side (or adjacent), an issue is a target lateral dimension D of the extensions 135, 145, 190, 195 and the resulting dimension C of the separation between the adjacent leads 120, 185. In the illustrated example, the separation distance C is between the second extension 145 of the first lead 120 and the first extension 190 of the second lead 185. Current designs have the dimension A, the nominal width of the central segment 125, 187 of the first and second leads 120, 185, respectively (a lead without extensions), and dimension B, the distance between leads without extensions. If the target dimension D of the extensions 135, 145, 190, 195 is too large, the dimension C of the separation between adjacent leads 120, 185 will be too tight, which can increase the risk of pad smear shorting.

The dimension C of the separation between adjacent leads 120, 185 should be sufficient to avoid electrical conduction therebetween such as, without limitation, 100 micrometers ("µm"). It may also be desirable to indicate a target dimension E, the nominal thickness of the extensions 135, 145, 190, 195. The thickness E of the first extension 135 of the first lead 120 may be substantially equal to a thickness E of the second extension 145 of the first lead 120. The thickness E of the first extension 190 of the second lead 185 may be substantially equal to a thickness E of the second extension 145 of the second lead 185. A dimension F indicates a nominal thickness of the central segments 125, 187. The central segments 125, 187 may have a thickness F greater than a thickness E of the first extension 135, 190 and the second extension 145, 195 of the first and second leads 120, 185, respectively.

The dimension A+2D, which is the total width of the leads 120, 185 can lead to a wider PCB land, which may reduce the separation distance C between adjacent leads 120, 185. Again, the separation distance C should be sufficient to reduce the risk of shorting during a surface-mount technology soldering operation.

The resulting C dimension can be kept to smaller in some flipchip QFN designs, for example, packages that do not use standard footprint designs. The leads as set forth herein may be employed for flipchip-MIS packages (also flipchip-multi-layer leadframe). The flipchip-MIS packages are custom packages, so pin width and pin-to-pin spacing are customized for each package. Target spacing and lead width specifications can be followed, even with the addition of the lateral extensions.

A PCB land width can be driven by lead width A, not necessarily by A+2D, since the E thickness dimension can be small, and the designs use greater than, for instance, 50 percent sidewall solder coverage, but not 100 percent. The crescent formed from the etch process to form a solder-wettable feature may etch a wider space, leaving a lesser concave feature in the leadframe solder-wettable feature area. Since the solution introduced herein may be defined, without limitation, for a flipchip package, which is a custom design for each device, the footprint dimensions can be defined per device and as per the application. The step dimensions of the leads and crescent etch dimensions can be determined after running a combination of design and etch design experiments.

The spacing rules based on manufacturability can be part of the leadframe design. Post-test inspection can be the standard wettable feature inspection that has specifications related to wettable feature width from a package bottom. The inspection challenge should be similar to dimpled wettable feature packages.

The solution introduced herein can be employed to get the enhanced dimensions for a wettable feature step cut when using advanced leadframe (multi-layer, plated, etc.) technology, which can be employed for a large portion of, for instance, the automotive industry. This solution also reduces the possibility of a copper burr (another customer return issue), during a singulation process.

This solution may suggest oversizing the metal feature during leadframe design, and also accordingly oversize the step cut etch mask to compensate for the curved edge finish. The solution introduced herein provides an improved and more reliable wettable flank, based on the new resulting shape thereof. There is no substantial additional cost to implement this change. The etch time is determined by the need to etch a full depth of that layer. Narrow leads often employ longer etch times to etch full depth. Wider copper area allows reduction of etch time, thereby reducing the lateral etch length.

The solution introduced herein can be applied to substantially all surface mount technology packages including QFN packages. There is a direct impact on manufacturability and reliability of wettable flanks on this substrate technology. The etch time is determined by the need to etch full depth of that layer.

Figure 5:
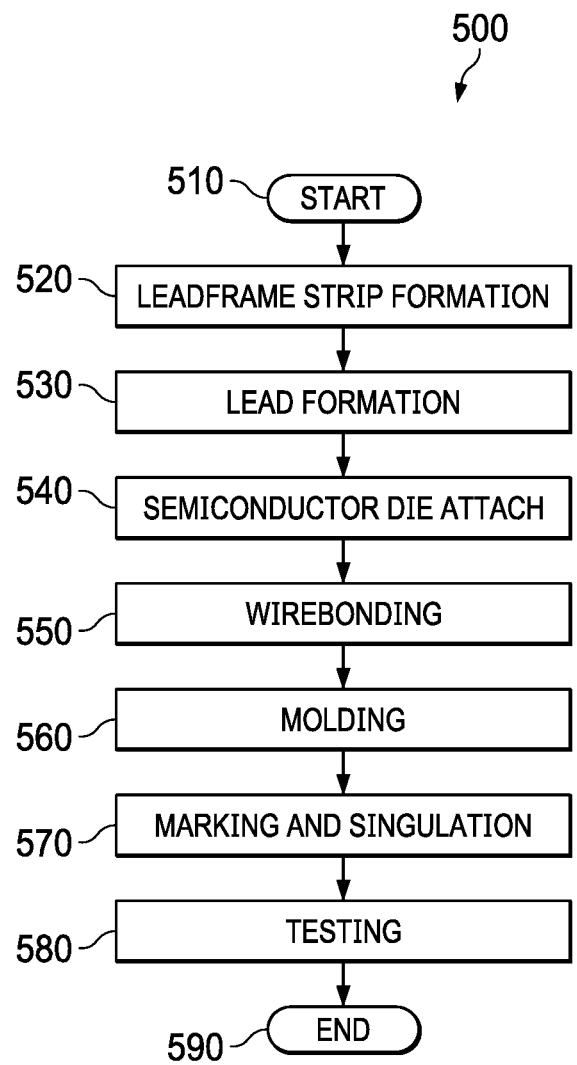
FIG. 5 illustrates a flow diagram of a method of forming a surface mount package.

Turning now to FIG. 5, illustrated is a flow diagram of a method 500 of forming a surface mount package. The method 500 begins at a start step 510 and transitions to a lead strip formation step 520 of a plurality of leadframes. At the lead strip formation step 520, a sheet of alloy such as a copper alloy is patterned using etching process. At a lead formation step 530, the lead is formed by an additional etching process and may be followed by a plating process for the plurality of leadframes. At a step 540, a semiconductor die is attached to a die attach pad by depositing a die-attach epoxy on each of the leadframe pads, placing the semiconductor die on the epoxy, and then curing the same. The semiconductor die is attached to a lead(s) via wire bonds at a step 550 for each of the leadframes. Of course other forms of connectivity are also acceptable. At a step 560, a molding compound covers the semiconductor die and other components with respect to each of the leadframes. At a step 570, the plurality of leadframes (encapsulated leadframes) are marked and singulated into respective surface mounted packages. Each of the surface mounted packages are tested at a step 580. The testing may include the connectivity to another component such as a PCB via visible inspection of the lead thereto. The method 500 concludes at a step 590.

Thus, with continuing reference to the aforementioned FIGUREs and reference numbers for illustrative purposes, a package (100) such as QFN package for a semiconductor device has been introduced herein. The package (100) includes a semiconductor die (160) attached to a die attach pad (155) via a die attach material (175). The package (100) also includes a lead (120) coupled to the semiconductor die and terminating on a first surface (e.g., a bottom surface 110) and an adjacent second surface (e.g., a side surface 115) of the package (100). A portion of the die attach pad (155) may be exposed on the first surface of the package. The lead (120) is configured to provide an electrical connection to another component such as a PCB (167).

The lead (120) includes a central segment (125) having a first side (130) and a second side (140), a first extension (135) from a portion of the first side (130), and a second extension (145) from a portion of the second side (140). A recess (150) of the lead (120) extends through a portion of the central segment (125), the first extension (135) and the second extension (145) of the lead (120). A portion of the lead (120) is exposed from a molding compound (180) covering the semiconductor die (160). The lead (120) may have a concave or step shape (see, for instance, the bottom view of FIG. 2).

The first extension (135) intersects a junction (137) between the central segment (125) and the recess (150) on the first side (130) of the central segment (125). The second extension (145) intersects a junction (147) between the central segment (125) and the recess (150) on the second side (140) of the central segment (125). The first extension (135) of the lead (120) includes an angular edge (139) opposite the recess (150). The second extension (145) of the lead (120) includes an angular edge (149) opposite the recess (150).

The central segment (125) may have a thickness (F) greater than a thickness (E) of the first extension (135) and the second extension (145). A thickness (E) of the first extension (135) may be substantially equal to a thickness (E) of the second extension (145).

The package (100) includes a plurality of leads including another lead (185) coupled to the semiconductor die (160) and terminating on the first surface (110) and the second surface (115) of the package (100). The another lead (185) includes a central segment (187) having a first side (188) and a second side (189), a first extension (190) from a portion of the first side (188), and a second extension (195) from a portion of the second side (189). A recess (197) of the another lead (185) extends through a portion of the central segment (187), the first extension (190) and the second extension (195) of the another lead (185). A portion of the another lead (185) is exposed from the molding compound (180) covering the semiconductor die (160). The lead (120) may be adjacent the another lead (185), and a separation distance (C) between the second extension (145) of the lead (120) and the first extension (190) of the another lead (185) may be sufficient to avoid electrical conduction between the lead (120) and the another lead (185).

For related processes to form leadless semiconductor packages, see U.S. patent application Ser. No. 15/220,782, entitled "Sawn Leadless Package Having Wettable Flank Leads," to Arshad, et al., filed Jul. 27, 2016, and U.S. patent application Ser. No. 15/488,594, entitled "Plated Ditch Pre-Mold Leadframe Semiconductor Package, and Method of Making Same," to Komatsu, et al., filed Apr. 17, 2017, which applications are incorporated herein by reference.

Although the present disclosure has been described in detail, various changes, substitutions and alterations may be made without departing from the spirit and scope of the disclosure in its broadest form. For instance, many different semiconductor packages can employ a wettable flank feature as described herein. Also, many of the features, functions, and steps of operating or forming the same may be reordered, omitted, added, etc., and still fall within the broad scope of the present disclosure.

Moreover, the scope of the present application is not intended to be limited to the particular examples of the process, machine, manufacture, composition of matter, means, methods and steps described in the specification. The processes, machines, manufacture, compositions of matter, means, methods, or steps, presently existing or later to be developed, that perform substantially the same function or achieve substantially the same result as the corresponding examples described herein may be utilized according to the present disclosure. Accordingly, the appended claims are intended to include within their scope such processes, machines, manufacture, compositions of matter, means, methods, or steps.

What is claimed:

1. A lead of a semiconductor package, comprising:
   a central segment having a first side and a second side;
   a first extension from a portion of the first side;
   a second extension from a portion of the second side; and
   a recess extending through a portion of the central segment, the first extension and the second extension;
   wherein the central segment has a thickness greater than a thickness of the first extension and the second extension.

2. The lead as recited in claim 1, wherein the first extension intersects a junction between the central segment and the recess on the first side of the central segment.

3. The lead as recited in claim 1, wherein a thickness of the first extension is substantially equal to a thickness of the second extension.

4. The lead as recited in claim 1, wherein the recess comprises a concave shape.

5. The lead as recited in claim 1, wherein the recess comprises a step shape.

6. The lead as recited in claim 1, wherein the first extension of the lead includes an angular edge opposite the recess.

7. A package, comprising:
a semiconductor die attached to a die attach pad; and
a lead coupled to the semiconductor die and terminating on a first surface and an adjacent second surface of the package, including:
a central segment having a first side and a second side;
a first extension from a portion of the first side;
a second extension from a portion of the second side; and
a recess extending through a portion of the central segment, the first extension and the second extension of the lead, a portion of the lead being exposed from a molding compound covering the semiconductor die; wherein the central segment has a thickness greater than a thickness of the first extension and the second extension.

8. The package as recited in claim 7, wherein the first extension intersects a junction between the central segment and the recess on the first side of the central segment.

9. The package as recited in claim 7, wherein a thickness of the first extension is substantially equal to a thickness of the second extension.

10. The package as recited in claim 7, wherein the recess comprises a concave shape.

11. The package as recited in claim 7, wherein the recess comprises a step shape.

12. The package as recited in claim 7, wherein the first extension of the lead includes an angular edge opposite the recess.

13. The package as recited in claim 7, further comprising:
another lead coupled to the semiconductor die and terminating on the first surface and the second surface of the package, including:
a central segment having a first side and a second side;
a first extension from a portion of the first side;
a second extension from a portion of the second side; and
a recess extending through a portion of the central segment, the first extension and the second extension of the another lead, a portion of the another lead being exposed from the molding compound covering the semiconductor die.

14. The package as recited in claim 13, wherein the lead is adjacent the another lead.

15. The package as recited in claim 14, wherein a separation distance between the second extension of the lead and the first extension of the another lead is sufficient to avoid electrical conduction between the lead and the another lead.

16. The package as recited in claim 7, wherein a portion of the die attach pad is exposed on the first surface of the package.

17. The package as recited in claim 7, wherein the lead is configured to provide an electrical connection to a printed circuit board.

18. The package as recited in claim 7, wherein the package is a quad flat no-lead (QFN) package.

* * * * *